United States Patent
Kiuchi et al.

(10) Patent No.: US 11,088,008 B2
(45) Date of Patent: *Aug. 10, 2021

(54) WAFER PROCESSING METHOD

(71) Applicant: DISCO CORPORATION, Tokyo (JP)

(72) Inventors: Hayato Kiuchi, Tokyo (JP); Keisuke Yamamoto, Tokyo (JP); Taichiro Kimura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 120 days.

This patent is subject to a terminal disclaimer.

(21) Appl. No.: 16/438,766

(22) Filed: Jun. 12, 2019

(65) Prior Publication Data

US 2019/0385887 A1 Dec. 19, 2019

(30) Foreign Application Priority Data

Jun. 19, 2018 (JP) .............................. JP2018-116015

(51) Int. Cl.
| | |
|---|---|
| *H01L 21/683* | (2006.01) |
| *B23K 26/364* | (2014.01) |
| *B23K 26/40* | (2014.01) |
| *H01L 21/78* | (2006.01) |

(Continued)

(52) U.S. Cl.
CPC ........ *H01L 21/6836* (2013.01); *B23K 26/364* (2015.10); *B23K 26/40* (2013.01); *C09J 7/255* (2018.01); *H01L 21/304* (2013.01); *H01L 21/78* (2013.01); *C08G 2170/40* (2013.01); *H01L 2221/6834* (2013.01); *H01L 2221/68327* (2013.01)

(58) Field of Classification Search
CPC ... H01L 21/304; H01L 21/78; H01L 21/6836; H01L 2221/68327; H01L 2221/6834; H01L 2221/68381; B23K 26/364; C09J 7/255; C08G 2170/40

See application file for complete search history.

(56) References Cited

U.S. PATENT DOCUMENTS 10,847,420 B2 * 11/2020 Harada .................... C09J 7/241
10,879,122 B2 * 12/2020 Harada ............ H01L 21/67103
(Continued)

FOREIGN PATENT DOCUMENTS

| JP | 2004296839 A | 10/2004 |
|---|---|---|
| JP | 2005246491 A | 9/2005 |

OTHER PUBLICATIONS

Kiuchi, Hayato, U.S. Appl. No. 16/421,556, filed May 24, 2019.

*Primary Examiner* — Savitri Mulpuri
(74) *Attorney, Agent, or Firm* — Greer Burns & Crain, Ltd.

(57) ABSTRACT

A wafer processing method includes a wafer providing step of providing the wafer by placing either of a polyolefin sheet or a polyester sheet each of which has a size equal to or larger than that of the wafer, on a flat upper surface of a support table and positioning a front surface of the wafer on an upper surface of the sheet, a sheet thermocompression bonding step of evacuating an enclosing environment in which the wafer is provided through the sheet on the support table, heating the sheet, pressing the wafer to pressure-bond the wafer to the sheet, thereby forming a raised portion by which an outer circumference of the wafer is surrounded, a back surface processing step of processing the back surface of the wafer, and a peeling step of peeling off the wafer from the sheet.

11 Claims, 4 Drawing Sheets

(51) Int. Cl.
*C09J 7/25* (2018.01)
*H01L 21/304* (2006.01)

(56) References Cited

U.S. PATENT DOCUMENTS

| | | | |
|---|---|---|---|
| 2004/0192012 A1* | 9/2004 | Takezoe | H01L 21/6835 |
| | | | 438/460 |
| 2008/0308225 A1 | 12/2008 | Kanamaru et al. | |
| 2009/0039533 A1 | 2/2009 | Lin et al. | |
| 2011/0187009 A1 | 8/2011 | Masuko et al. | |
| 2016/0257861 A1 | 9/2016 | Oliver et al. | |
| 2017/0152408 A1 | 6/2017 | Kirikae et al. | |
| 2017/0198176 A1 | 7/2017 | Kamochi et al. | |
| 2018/0016471 A1* | 1/2018 | Kamochi | B32B 7/06 |
| 2019/0378746 A1* | 12/2019 | Kiuchi | H01L 21/6835 |
| 2019/0378758 A1* | 12/2019 | Harada | H01L 21/78 |
| 2019/0393089 A1* | 12/2019 | Zhao | B23K 26/364 |
| 2020/0058537 A1* | 2/2020 | Sekiya | H01L 24/85 |

\* cited by examiner

FIG. 1A
FIG. 1B
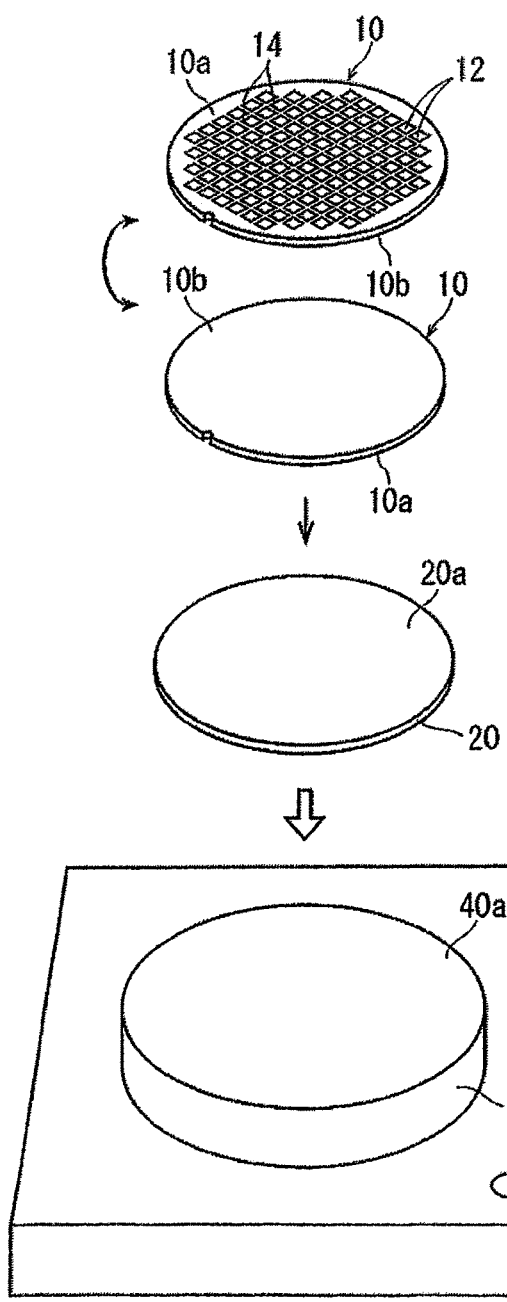
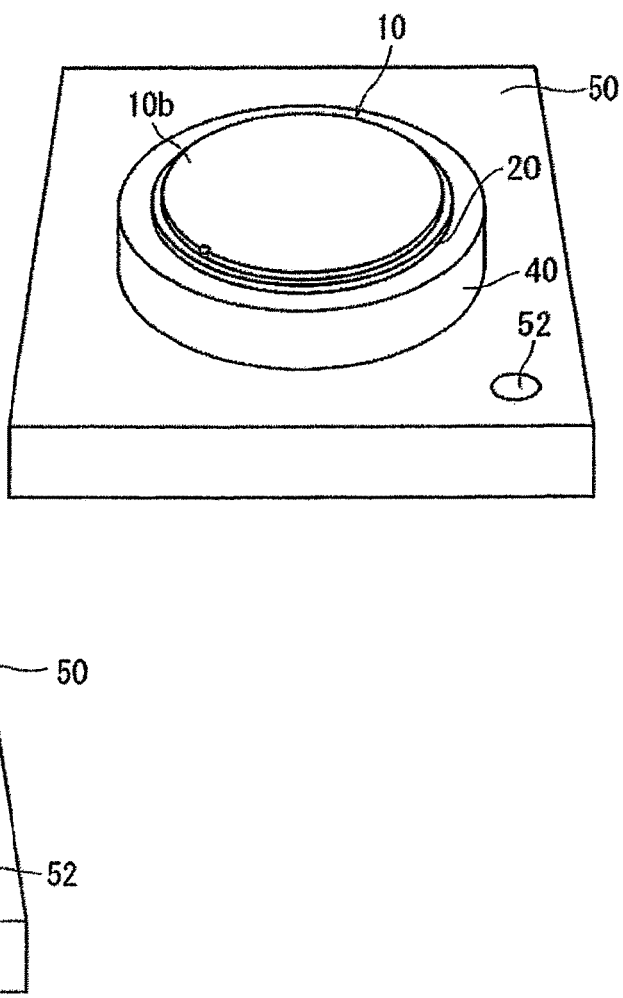

FIG.3
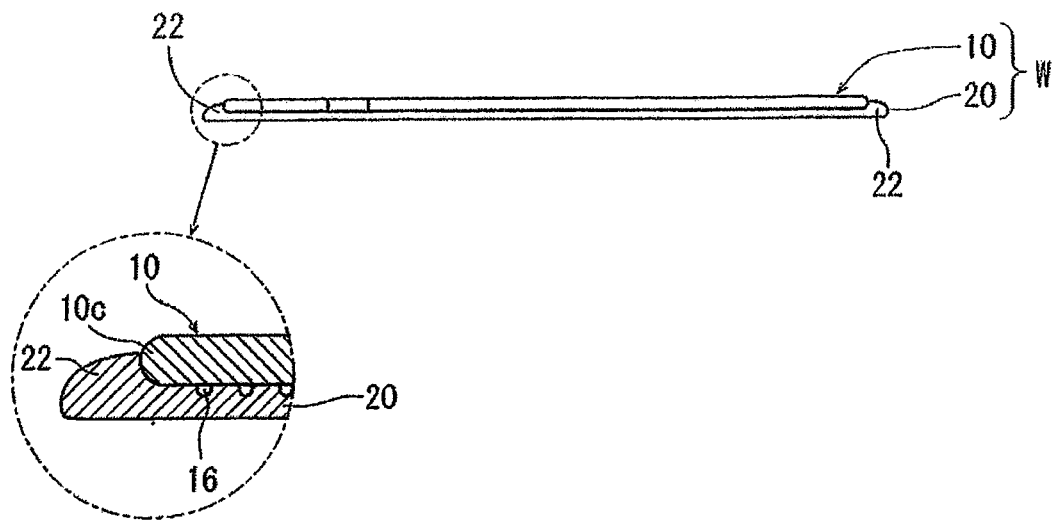
FIG.4A
FIG.4B
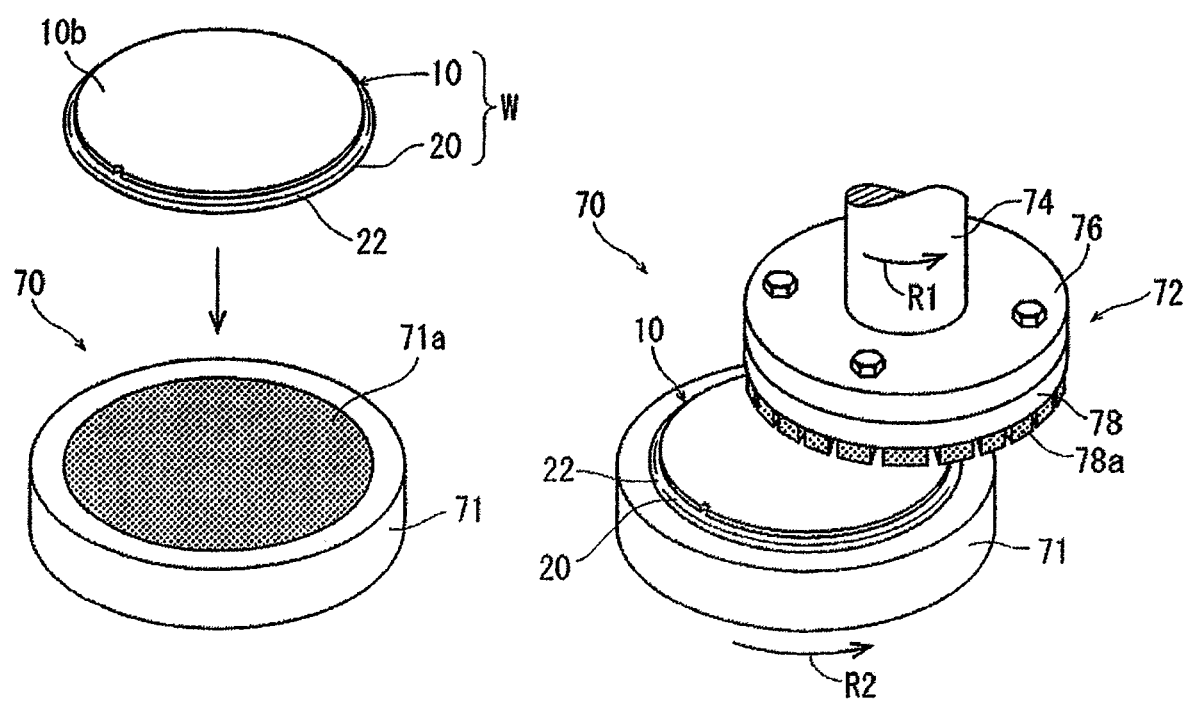

WAFER PROCESSING METHOD

BACKGROUND OF THE INVENTION

Field of the Invention

The present invention relates to a wafer processing method of processing a back surface of a wafer.

Description of the Related Art

In processing a wafer having a plurality of devices such as integrated circuits (ICs) and large-scale integrations (LSIs) on a front surface thereof, the plurality of devices being partitioned by a plurality of crossing division lines formed on the front surface of the wafer, a back surface of the wafer is ground by using a grinding apparatus to thereby reduce a thickness of the wafer to a predetermined thickness. Thereafter, the wafer is divided along the division lines by using a dicing apparatus (dicing saw) to thereby obtain a plurality of individual device chips. These device chips thus divided are used in electrical equipment such as mobile phones and personal computers.

The grinding apparatus includes a chuck table having a holding surface for holding a wafer thereon, a grinding unit rotatably provided with a grinding wheel grinding an upper surface of the wafer held on the chuck table, and feeding means feeding a grinding stone, and can reduce a thickness of the wafer to a desired thickness by grinding the wafer (see Japanese Patent Laid-Open No. 2005-246491).

SUMMARY OF THE INVENTION

When the back surface of the wafer is ground by using the grinding apparatus, in order to prevent the plurality of devices formed on the front surface side of the wafer from being damaged due to contact between the holding surface of the chuck table and the front surface of the wafer, a protective tape having an adhesive layer may be attached to the front surface side of the wafer, in some cases. However, when the wafer is placed on the chuck table with the protective tape provided on the front surface of the wafer and then ground by the grinding apparatus, an intensive load is applied in a grinding feeding direction (vertical direction) and a horizontal direction, so that the wafer is displaced with respect to the protective tape provided on the front surface of the wafer, resulting in damage to the wafer.

In particular, in a case in which a plurality of projecting electrodes called bumps are formed on the device formed on the front surface of the wafer, a contact area between the front surface of the wafer and the protective tape becomes relatively small, and as a result, the wafer is not supported stably by the protective tape, thereby easily causing the damage to the wafer as described above.

In addition, when grinding is finished and the protective tape is peeled off from the front surface of the wafer, a sticking agent, a wax, or the like which is used in attaching the protective tape to the wafer is adhered to the bumps to remain thereon, which deteriorates quality of the device. When a step of removing the sticking agent, the wax, or the like after the peeling step is added in order to eliminate the above problem, productivity is also lowered. As an alternative, there is proposed a method in which a liquid resin is coated on the front surface of the wafer in place of the protective tape and a resin layer is then formed to protect the front surface of the wafer. In this method, however, a step of completely removing the liquid resin from the front surface of the wafer requires much labor. Accordingly, this method also causes a problem in quality of the device and productivity.

It is therefore an object of the present invention to provide a wafer processing method which does not lower productivity and quality of a device when a back surface of a wafer is processed.

In accordance with an aspect of the present invention, there is provided a wafer processing method of processing a back surface of a wafer having a plurality of devices formed on a front surface of the wafer, the plurality of devices being individually partitioned by a plurality of crossing division lines formed on the front surface of the wafer, the method including: a wafer providing step of providing the wafer by placing either of a polyolefin sheet or a polyester sheet each of which has a size equal to or larger than that of the wafer, on a flat upper surface of a support table and positioning the front surface of the wafer on an upper surface of the sheet; a sheet thermocompression bonding step of evacuating an enclosing environment in which the wafer is provided through the sheet on the support table, heating the sheet, pressing the wafer to pressure-bond the wafer to the sheet, thereby forming a raised portion by which an outer circumference of the wafer is surrounded, after carrying out the wafer providing step; a back surface processing step of processing the back surface of the wafer after carrying out the sheet thermocompression bonding step; and a peeling step of peeling off the wafer from the sheet, after carrying out the back surface processing step.

Preferably, the support table includes heating means, and the support table is heated by the heating means in the sheet thermocompression bonding step. Also, the upper surface of the support table is coated with a fluorine resin. Preferably, grinding is performed on the back surface of the wafer in the back surface processing step. Preferably, the polyolefin sheet is selected from the group consisting of a polyethylene sheet, a polypropylene sheet, and a polystyrene sheet.

Preferably, in a case in which the polyolefin sheet is selected, the polyolefin sheet includes the polyethylene sheet, and the polyolefin sheet is heated to a temperature in the range of 120° C. to 140° C. in the sheet thermocompression bonding step. Also, in a case in which the polyolefin sheet is selected, the polyolefin sheet includes the polypropylene sheet, and the polyolefin sheet is heated to a temperature in the range of 160° C. to 180° C. in the sheet thermocompression bonding step. Further, in a case in which the polyolefin sheet is selected, the polyolefin sheet includes the polystyrene sheet, and the polyolefin sheet is heated to a temperature in the range of 220° C. to 240° C. in the sheet thermocompression bonding step.

Preferably, the polyester sheet is selected from the group consisting of a polyethylene terephthalate sheet and a polyethylene naphthalate sheet. Preferably, in a case in which the polyester sheet is selected, the polyester sheet includes the polyethylene terephthalate sheet, and the polyester sheet is heated to a temperature in the range of 250° C. to 270° C. in the sheet thermocompression bonding step. Also, in a case in which the polyester sheet is selected, the polyester sheet includes the polyethylene naphthalate sheet, and the polyester sheet is heated to a temperature in the range of 160° C. to 180° C. in the sheet thermocompression bonding step.

According to the present invention, the wafer is supported by the sheet with a sufficient force, thereby preventing the wafer from being damaged even when the back surface of the wafer is subjected to processing. Also, even when a plurality of bumps are formed on the front surface of each of the devices, the bumps are embedded in the sheet, enabling secure support of the wafer to the sheet. As a result, a stress in grinding the back surface of the wafer is dispersed, so that a problem of causing damage to the wafer is eliminated.

Further, according to the processing method of the present invention, since the wafer is united to the sheet by thermocompression bonding, even when the sheet is peeled off from the back surface of the wafer after the back surface processing step is finished, a problem that a sticking agent, a wax, a liquid resin, or the like remains on the bump may not occur, thereby eliminating a problem of degradation in quality of the device.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 1A is an exploded perspective view illustrating an implementation mode of a wafer providing step in a wafer processing method according to a preferred embodiment of the present invention;

FIG. 1B is a perspective view illustrating a state in which the wafer is placed through a sheet on a support table in the wafer providing step of FIG. 1A;

FIG. 3 is a side view illustrating a wafer unit obtained through the sheet thermocompression bonding step illustrated in FIGS. 2A to 2C, with a partially enlarged cross-sectional view in which a part of the wafer unit is illustrated in enlarged section in a circle portion;

FIGS. 4A and 4B are perspective views illustrating an implementation mode of a back surface processing step in the wafer processing method according to the preferred embodiment;

DETAILED DESCRIPTION OF THE PREFERRED EMBODIMENT

Figure 2A:
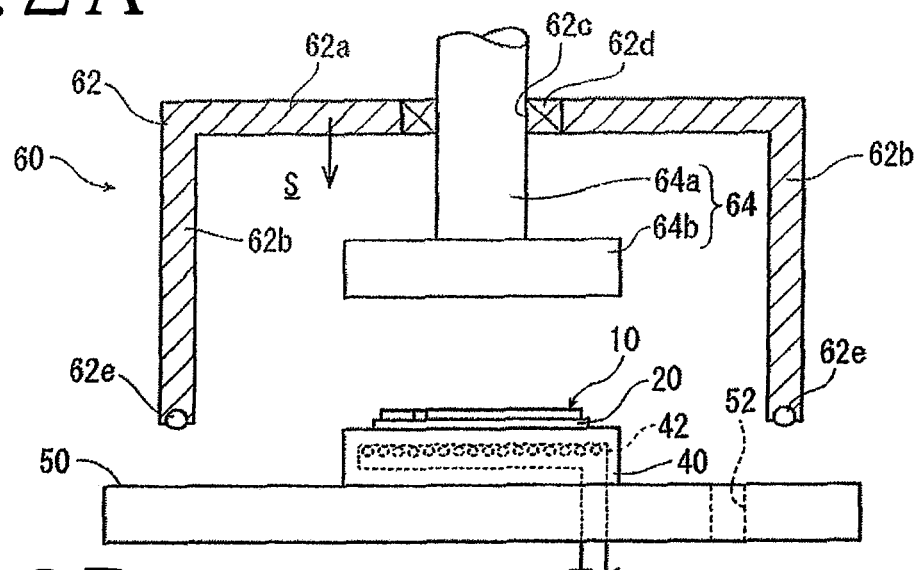
FIGS. 2A to 2C are side views illustrating an implementation mode of a sheet thermocompression bonding step in the wafer processing method according to the preferred embodiment.

A preferred embodiment of a processing method of processing a back surface of a wafer configured according to the present invention will be described in detail below with reference to the attached drawings. Upon carrying out the wafer processing method according to the present embodiment, first, as illustrated in FIG. 1A, a wafer 10 as a workpiece and a sheet 20 are prepared. The wafer 10 has a front surface 10a partitioned by a plurality of division lines 14 in a grid pattern into individual separate regions where a plurality of devices 12 are individually formed. The sheet 20 is set to a size (diameter) at least equal to or larger than that of the wafer 10 and includes a polyolefin sheet or a polyester sheet. In the present embodiment, a polyethylene (PE) sheet of polyolefin is selected as the sheet 20.

(Wafer Providing Step)

First, the wafer 10 and the sheet 20 are prepared. Then, as illustrated in FIG. 1A, with a back surface 10b of the wafer 10 facing upward, in other words, with the front surface 10a of the wafer 10 facing downward, the wafer 10 is placed through an upper surface 20a of the sheet 20 on an upper surface 40a of a support table 40 (see FIG. 1B). The support table 40 is provided on a base 50, and the upper surface 40a of the support table 40 is formed to be flat and coated with a fluorine resin.

(Sheet Thermocompression Bonding Step)

Figure 2B:
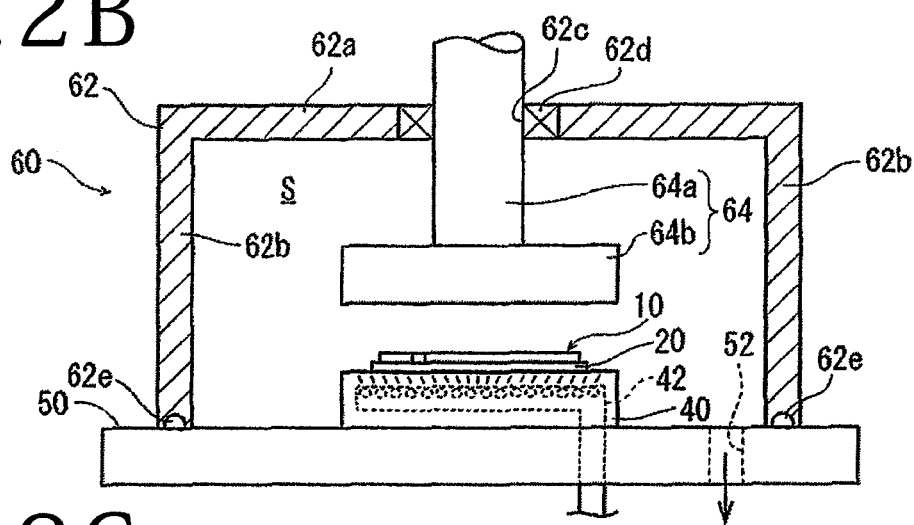
Figure 2C:
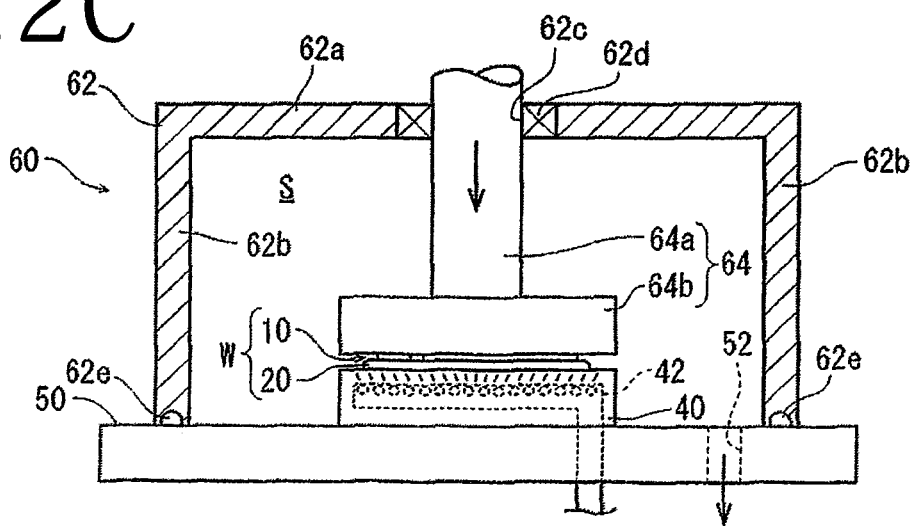

After the wafer providing step is carried out, a sheet thermocompression bonding step illustrated in FIGS. 2A to 2C is next carried out. The sheet thermocompression bonding step is a step of placing the wafer 10 provided on the sheet 20 in an enclosed environment, evacuating this enclosed environment, heating the sheet 20 and pressing the wafer 10, thereby achieving thermocompression bonding of the wafer 10 and the sheet 20. Note that an electric heater 42 and a temperature sensor (not illustrated) are installed inside the support table 40 as heating means. The electric heater 42 and the temperature sensor are connected to a control unit and a power source (both not illustrated), and the support table 40 can be adjusted to a desired temperature by the electric heater 42 and the temperature sensor. A detailed description will be given below regarding the sheet thermocompression bonding step.

In order to carry out the sheet thermocompression bonding step, a thermocompression bonding apparatus 60 illustrated in FIG. 2A is used. The thermocompression bonding apparatus 60 includes an enclosing cover member 62 for forming an enclosed environment containing the support table 40. Note that, although FIGS. 2A to 2C are each a side view of the thermocompression bonding apparatus 60, for convenience in describing an internal configuration of the thermocompression bonding apparatus 60, a cross-section is illustrated only for the enclosing cover member 62. The enclosing cover member 62 is a box-like member covering an entire upper surface of the base 50 and includes a rectangle upper wall 62a and a side wall 62b extending downward from an outer peripheral end of the upper wall 62a, with a lower side thereof opposite to the upper wall 62a opened. At a center of the upper wall 62a, there is formed an opening 62c through which a support shaft 64a of a pressing member 64 passes to move up and down in the vertical direction. Also, in order to achieve the enclosed environment by hermetically sealing an inside space S in the enclosing cover member 62 while moving up and down the support shaft 64a in the vertical direction, a seal structure 62d is formed between an outer periphery of the support shaft 64a and the opening 62c. At a lower end of the support shaft 64a, a pressing plate 64b is provided. The pressing plate 64b is a disc-like shape having a diameter at least larger than the wafer 10, preferably a size slightly larger than the support table 40. A lower end surface of the side wall 62b of the enclosing cover member 62 has an elastic seal member 62e provided circumferentially. Also, although not illustrated, driving means moving the pressing member 64 up and down in the vertical direction is provided above the pressing member 64.

When the wafer 10 is placed through the sheet 20 on the support table 40, the enclosing cover member 62 positioned above the base 50 is lowered as illustrated in FIG. 2A until the lower end surface of the side wall 62b of the enclosing cover member 62 abuts on the base 50 (see FIG. 2B). At this time, the pressing plate 64b is raised to an upper position where the pressing plate 64b is not in contact with the upper surface of the wafer 10 as illustrated in FIG. 2B. When the lower end surface of the side wall 62b of the enclosing cover member 62 abuts on the base 50, the elastic seal member 62e provided on the lower end surface of the side wall 62b comes in close contact with the upper surface of the base 50 to achieve the enclosing environment inside the enclosing cover member 62. In the vicinity of the support table 40 on the base 50, provided is a suction hole 52 through which suction means (not illustrated) is connected with the internal space S defined by the enclosing cover member 62.

As illustrated in FIG. 2B, when the enclosing cover member 62 is placed on the base 50 such that the lower end surface of the side wall 62b of the enclosing cover member 62 abuts on the base 50 to achieve the enclosing environment inside the internal space S of the enclosing cover member 62, the suction means is operated to suck the air inside the internal space S through the suction hole 52 to evacuate until a pressure in a region including the wafer 10 becomes a state close to a vacuum. At the same time, the electric heater 42 of the support table 40 is operated to heat the sheet 20 supporting the wafer 10 thereon. In this operation of the electric heater 42, the temperature of the support table 40 is controlled by the temperature sensor not illustrated, whereby the sheet 20 is heated such that polyethylene in the sheet 20 becomes a temperature close to its melting point (in the range of 120° C. to 140° C.). Further, at the same time as heating the sheet 20, as illustrated in FIG. 2C, the pressing plate 64b is lowered to come in contact with the wafer 10, applying a pressing force equally to the entire upper surface of the wafer 10. In this manner, the internal space S housing the wafer 10 is evacuated to a state close to a vacuum, so that the air remaining between the wafer 10 and the sheet 20 is sucked to be removed. Then, the sheet 20 is heated to the temperature described above to be softened and increase in adhesion, whereby the sheet 20 and the wafer 10 are subjected to thermocompression bonding to form a wafer unit W. Thus, the sheet thermocompression bonding step is completed. When the sheet thermocompression bonding step is completed in this manner, the suction means not illustrated and the electric heater 42 are stopped, the pressing plate 64b is raised upward, and the enclosing cover member 62 is drawn up. When the temperature of the sheet 20 is lowered close to the room temperature, the wafer unit W can be unloaded from the support table 40. In this embodiment, since the upper surface 40a of the support table 40 is coated with a fluorine resin, even if the sheet 20 increases its adhesion by heat, the wafer unit W can be easily separated from the support table 40.

A description will be further given regarding the wafer unit W formed by carrying out the sheet thermocompression bonding step described above with reference to FIG. 3. As described above, the sheet thermocompression bonding step enables close contact between the sheet 20 and the wafer 10 by heating the sheet 20 to be softened and then pressing downward the wafer 10 through the sheet 20 placed on the support table 40 under a vacuum state in the enclosing environment.

Accordingly, the wafer 10 is supported to the sheet 20 with a sufficient supporting force without applying a sticking agent, a wax, or the like to the wafer 10. Further, even when a plurality of bumps 16 are formed on each of the devices 12 formed on the front surface 10a of the wafer 10, the air in the vicinity of the bumps 16 is completely sucked and removed, as a cross-section of an end portion of the wafer unit W is illustrated in an enlarged manner in a circle portion in FIG. 3, the plurality of bumps 16 are embedded in the softened sheet 20 through heating, and the wafer 10 and the sheet 20 are in close contact with each other, achieving the uniting of the sheet 20 and the wafer 10. Then, since the sheet 20 has a size (diameter) equal to or larger than that of the wafer 10, a peripheral portion of the sheet 20 is raised and formed as a raised portion 22. As a result, an outer circumference 10c of the wafer 10 is surrounded by the raised portion 22 thus formed.

(Back Surface Processing Step)

After the sheet thermocompression bonding step described above is carried out, the back surface processing step is carried out in which grinding is performed on the back surface 10b of the wafer 10 in the wafer unit W. A description regarding the back surface processing step will be specifically given below.

As illustrated in FIG. 4A, the wafer unit W obtained through the sheet thermocompression bonding step is transferred to a grinding apparatus 70 (only partly illustrated) for grinding, the wafer unit W is placed on a suction chuck 71a of a chuck table 71 included in the grinding apparatus 70 with the sheet 20 facing downward. The suction chuck 71a is composed of a porous ceramic having gas permeability, and suction means (not illustrated) connected to the chuck table 71 is operated, so that the wafer unit W is sucked and held on the chuck table 71.

After the wafer unit W is held under suction on the chuck table 71, the back surface 10b of the wafer 10 is ground by the grinding apparatus 70 illustrated in FIG. 4B. The grinding apparatus 70 includes a grinding unit 72 for grinding the back surface 10b of the wafer 10 as the wafer unit W held under suction on the chuck table 71 to reduce a thickness of the wafer 10. The grinding unit 72 includes a rotary spindle 74, a mounter 76, and a grinding wheel 78. The rotary spindle 74 is rotated by a rotational driving mechanism not illustrated. The mounter 76 is mounted to a lower end of the rotary spindle 74. The grinding wheel 78 is attached to a lower surface of the mounter 76, and has grinding stones 78a provided annularly on a lower surface thereof.

In a condition where the wafer 10 is held under suction on the chuck table 71 with the back surface 10b of the wafer 10 exposed upward, the rotary spindle 74 of the grinding unit 72 is rotated at 6000 rpm, for example, in a direction of an arrow R1 in FIG. 4B, and the chuck table 71 is also rotated at 300 rpm, for example, in a direction of an arrow R2 in FIG. 4B. Then, the grinding unit 72 is lowered to bring the grinding stones 78a into contact with the back surface 10b of the wafer 10, and the grinding wheel 78 is fed downward, in other words, in a direction perpendicular to the chuck table 71, at a grinding feeding speed of 1 μm/s, for example. At this time, the grinding can be proceeded while measuring the thickness of the wafer 10 by using a contact type measuring gauge (not illustrated). Accordingly, the back surface 10b of the wafer 10 is ground until the thickness of the wafer 10 is reduced to a predetermined thickness, for example, 50 μm. Thus, the back surface processing step is completed.

(Peeling Step)

When the back surface processing step is completed, the peeling step of peeling off the sheet 20 from the wafer 10 is carried out. The steps of carrying out the peeling step will be described below with reference to FIGS. 5A and 5B.

Figure 5A:
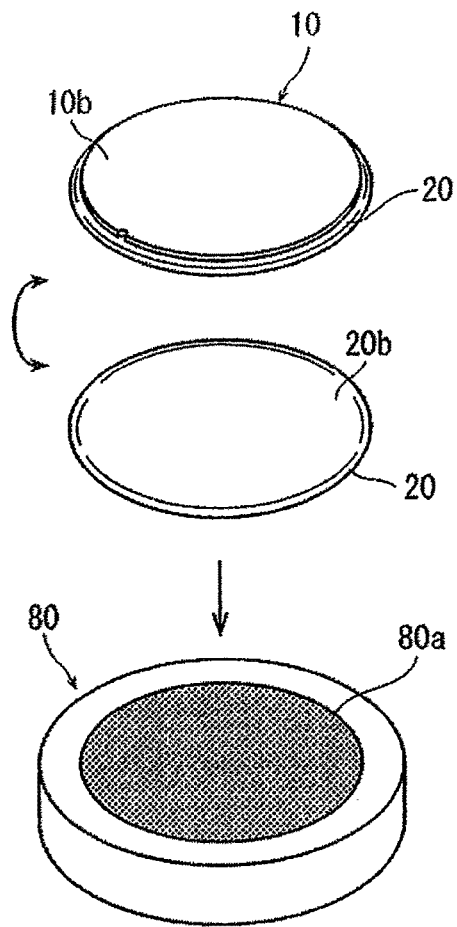
FIGS. 5A and 5B are perspective views illustrating a peeling step in the wafer processing method according to the preferred embodiment.

After being ground and thinned in the back surface processing step, the wafer 10 is unloaded from the chuck table 71 of the grinding apparatus 70 along with the sheet 20. The wafer 10 unloaded from the chuck table 71 is transferred to a peeling chuck table 80 illustrated in FIG. 5A. The wafer 10 and the sheet 20 are inverted as illustrated in FIG. 5A and placed on a suction chuck 80a of the peeling chuck table 80 with the back surface 20b of the sheet 20 facing upward, in other words, with the back surface 10b of the wafer 10 facing downward. In this case, although the peeling chuck table 80 has a configuration similar to the chuck table 71 of the grinding apparatus 70 described above, the suction chuck 80a of the peeling chuck table 80 is set to a diameter substantially equal to that of the wafer 10, whereas the suction chuck 71a of the grinding apparatus 70 is set to a diameter substantially equal to that of the sheet 20.

Figure 5B:
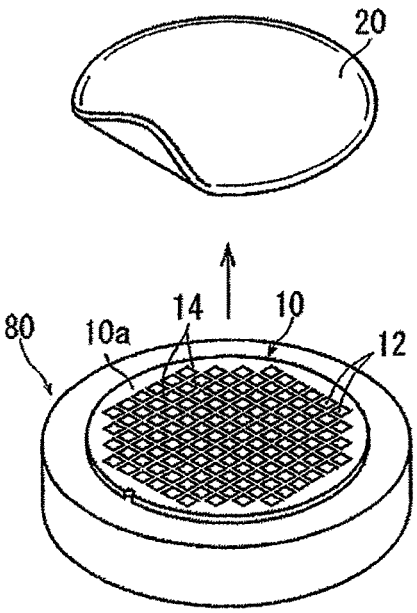

When operating suction means not illustrated causes the wafer 10 to be held under suction on the peeling chuck table 80, the sheet 20 is peeled off from the wafer 10 in a manner illustrated in FIG. 5B. Note that the sheet 20 is selected from a polyolefin sheet or a polyester sheet. Accordingly, the sheet 20 can be curved in peeling from the wafer 10, which is favorable. In addition, when the sheet 20 is heated in carrying out the peeling step, the sheet 20 is softened, thereby enabling easier peeling of the sheet 20 from the wafer 10.

In the foregoing description, the sheet 20 is heated in peeling off the sheet 20 from the wafer 10 in the preferred embodiment. As an alternative case, the adhesion of the sheet 20 may be reduced by cooling the sheet 20. In this case, the sheet 20 may be cooled to reduce the adhesion before carrying out the peeling step. It is only necessary to select whether the sheet 20 is to be heated or to be cooled in carrying out the peeling step according to a characteristic of a material of the sheet 20.

According to the present embodiment, by carrying out the sheet thermocompression bonding step, the wafer 10 is supported to the sheet 20 with a sufficient force, and the raised portion 22 surrounding the outer circumference 10c of the wafer 10 is formed. As a result, the wafer is stably supported to the sheet 20 in grinding the wafer 10, and even when the back surface 10b of the wafer 10 is subjected to grinding, damage to the wafer can be prevented. In addition, even when a plurality of bumps are formed on each of the devices 12 formed on the front surface 10a of the wafer 10, the air present between the front surface 10a of the wafer 10 and the sheet 20 is sucked and removed, and at the same time, the bumps are embedded in the sheet 20 which has been softened by heating and the wafer 10 as a whole is equally supported to the sheet 20. As a result, a stress in grinding the wafer 10 is dispersed, so that it is possible to prevent the wafer 10 and the bumps from being damaged. Further, in the present embodiment, the wafer 10 is supported to the sheet 20 by thermocompression bonding, and a liquid resin, a sticking agent, a wax, or the like is not interposed between the sheet 20 and the wafer 10. Accordingly, even when the wafer 10 is peeled off from the sheet 20, the liquid resin, the sticking agent, the wax, or the like does not remain on the devices 12. Hence, a problem of degrading the quality of the devices 12 does not occur.

Note that, although the sheet 20 includes the polyethylene sheet in the foregoing embodiment, the present invention is not limited to this. The sheet 20 capable of supporting the wafer 10 without requiring a liquid resin, a sticking agent, a wax, or the like can be suitably selected from a polyolefin sheet and a polyester sheet. Examples of the polyolefin sheet include a polyethylene sheet, a polypropylene (PP) sheet, and a polystyrene (PS) sheet, for example. Also, examples of the polyester sheet include a polyethylene terephthalate (PET) sheet and a polyethylene naphthalate (PEN) sheet, for example.

According to the foregoing embodiment, the temperature in heating the sheet 20 in the sheet thermocompression bonding step has been set to a temperature (in the range of 120° C. to 140° C.) close to a melting point of the polyethylene sheet. In a case in which the sheet 20 is any sheet other than the polyethylene sheet as described above, it is preferable to heat the selected sheet to a temperature close to a melting point of a material of the selected sheet. For example, when the sheet 20 is the polypropylene sheet, the temperature in heating is preferably set in the range of 160° C. to 180° C. When the sheet 20 is the polystyrene sheet, the temperature in heating is preferably set in the range of 220° C. to 240° C. Also, when the sheet 20 is the polyethylene terephthalate sheet, the temperature in heating is preferably set in the range of 250° C. to 270° C. Moreover, when the sheet 20 is the polyethylene naphthalate sheet, the temperature in heating is preferably set in the range of 160° C. to 180° C.

Figure 6A:
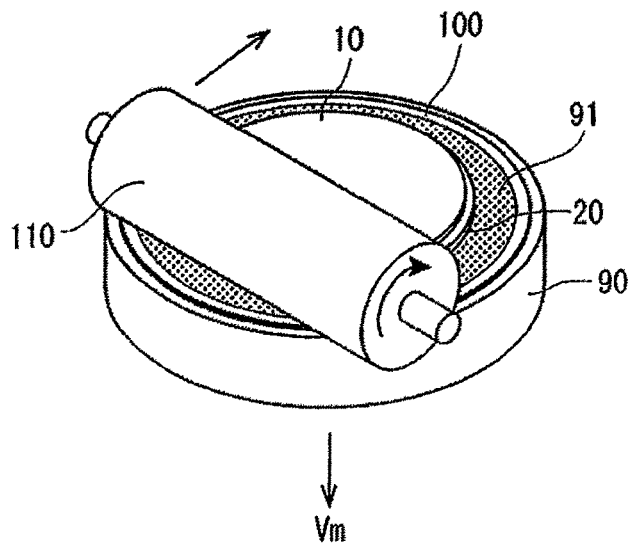
FIG. 6A is a perspective view illustrating a sheet thermocompression bonding step according to a modification of the preferred embodiment.
Figure 6B:
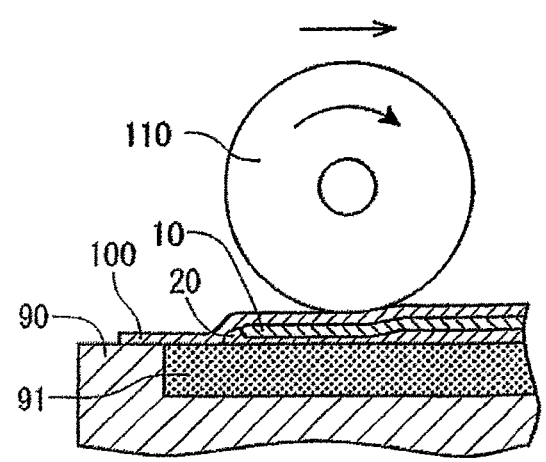
FIG. 6B is an enlarged cross-sectional view of an essential part of FIG. 6A.

In addition, in the foregoing embodiment, the enclosing cover member 62 forms the enclosing environment. However, the present invention is not limited to this. For example, as illustrated in FIG. 6A, the wafer 10 along with the sheet 20 is held on a chuck table 90 having a suction chuck 91 larger in diameter than the sheet 20, and the entire upper surface of the suction chuck 91 on which the wafer 10 is held is covered with a film-like member 100, and then, a negative pressure Vm is applied from the suction chuck 91. As a result, an enclosing environment formed by the film-like member 100 having the wafer 10 inside in cooperation with the upper surface of the suction chuck 91 is evacuated, so that a pressure in a space inside the enclosing environment can be reduced. Thereafter, as illustrated in FIG. 6B as an enlarged cross-sectional view of an essential part of FIG. 6A, a roller 110 provided with heating means (not illustrated) is used to press the entire back surface 10b of the wafer 10 through the film-like member 100 as heating the sheet 20 to a desired temperature. In this manner, the sheet thermocompression bonding step in the present invention can also be carried out.

In the foregoing embodiment, there has been described an example in which the back surface processing step in the present invention is applied to grinding processing of grinding the back surface of the wafer. However, the present invention is not limited to this. As an alternative, the back surface processing step in the present invention may be applied to polishing processing of polishing the back surface of the wafer, and an effect similar to that of the embodiment described above can be exhibited.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method of processing a back surface of a wafer having a plurality of devices formed on a front surface of the wafer, the plurality of devices being individually partitioned by a plurality of crossing division lines formed on the front surface of the wafer, the method comprising:
   a wafer providing step of providing the wafer by placing either of a polyolefin sheet or a polyester sheet each of which has a size equal to or larger than that of the wafer, on a flat upper surface of a support table and positioning the front surface of the wafer on an upper surface of the sheet;
   a sheet thermocompression bonding step of evacuating an enclosing environment in which the wafer is provided through the sheet on the support table, heating the sheet, pressing the wafer to pressure-bond the wafer to the sheet, thereby forming a raised portion by which an outer circumference of the wafer is surrounded, after carrying out the wafer providing step;

a back surface processing step of processing the back surface of the wafer after carrying out the sheet thermocompression bonding step; and a peeling step of peeling off the wafer from the sheet, after carrying out the back surface processing step.

2. The wafer processing method according to claim 1, wherein:

the support table includes heating means, and the support table is heated by the heating means in the sheet thermocompression bonding step.

3. The wafer processing method according to claim 1, wherein:

the upper surface of the support table is coated with a fluorine resin.

4. The wafer processing method according to claim 1, wherein: grinding is performed on the back surface of the wafer in the back surface processing step.

5. The wafer processing method according to claim 1, wherein:

the polyolefin sheet is selected from the group consisting of a polyethylene sheet, a polypropylene sheet, and a polystyrene sheet.

6. The wafer processing method according to claim 5, wherein:

in a case in which the polyolefin sheet is selected, the polyolefin sheet includes the polyethylene sheet, and the polyolefin sheet is heated to a temperature in the range of 120° C. to 140° C. in the sheet thermocompression bonding step.

7. The wafer processing method according to claim 5, wherein:

in a case in which the polyolefin sheet is selected, the polyolefin sheet includes the polypropylene sheet, and the polyolefin sheet is heated to a temperature in the range of 160° C. to 180° C. in the sheet thermocompression bonding step.

8. The wafer processing method according to claim 5, wherein:

in a case in which the polyolefin sheet is selected, the polyolefin sheet includes the polystyrene sheet, and the polyolefin sheet is heated to a temperature in the range of 220° C. to 240° C. in the sheet thermocompression bonding step.

9. The wafer processing method according to claim 1, wherein:

the polyester sheet is selected from the group consisting of a polyethylene terephthalate sheet and a polyethylene naphthalate sheet.

10. The wafer processing method according to claim 7, wherein:

in a case in which the polyester sheet is selected, the polyester sheet includes the polyethylene terephthalate sheet, and the polyester sheet is heated to a temperature in the range of 250° C. to 270° C. in the sheet thermocompression bonding step.

11. The wafer processing method according to claim 7, wherein:

in a case in which the polyester sheet is selected, the polyester sheet includes the polyethylene naphthalate sheet, and the polyester sheet is heated to a temperature in the range of 160° C. to 180° C. in the sheet thermocompression bonding step.

* * * * *